United States Patent
Chou et al.

(10) Patent No.: US 7,790,491 B1
(45) Date of Patent: Sep. 7, 2010

(54) METHOD FOR FORMING NON-VOLATILE MEMORY CELLS AND RELATED APPARATUS AND SYSTEM

(75) Inventors: Li-Heng Chou, Portland, ME (US); Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/151,437

(22) Filed: May 7, 2008

(51) Int. Cl.
*H01L 21/00* (2006.01)

(52) U.S. Cl. .................. 438/48; 438/29; 438/53; 438/458; 438/509; 438/597; 438/611; 438/652; 438/689; 257/E21.002

(58) Field of Classification Search .......... 438/42, 438/480
See application file for complete search history.

(56) References Cited

U.S. PATENT DOCUMENTS

| | | | |
|---|---|---|---|
| 5,872,489 A * | 2/1999 | Chang et al. ............ | 331/179 |
| 6,015,736 A | 1/2000 | Luning et al. | |
| 6,057,081 A | 5/2000 | Yunogami et al. | |
| 6,153,478 A | 11/2000 | Lin et al. | |
| 6,229,683 B1 | 5/2001 | Goodwin-Johansson | |
| 6,238,850 B1 | 5/2001 | Bula et al. | |
| 6,296,991 B1 | 10/2001 | Lin | |
| 6,387,755 B1 | 5/2002 | Thurgate et al. | |
| 6,632,321 B2 | 10/2003 | Lill et al. | |
| 6,670,081 B2 | 12/2003 | Laidig et al. | |
| 6,716,570 B2 | 4/2004 | Nagarajan et al. | |
| 6,846,618 B2 | 1/2005 | Hsu et al. | |
| 7,041,434 B2 | 5/2006 | Raebiger et al. | |
| 7,488,672 B2 | 2/2009 | Kim | |
| 7,537,979 B2 | 5/2009 | Isobe et al. | |
| 2002/0145915 A1 | 10/2002 | Ogura et al. | |
| 2004/0023499 A1 | 2/2004 | Hellig et al. | |
| 2006/0273166 A1 | 12/2006 | Ohshima | |
| 2007/0037098 A1 | 2/2007 | Anderson et al. | |
| 2007/0148973 A1 | 6/2007 | Higashitani et al. | |
| 2008/0048164 A1 | 2/2008 | Odagawa | |

OTHER PUBLICATIONS

S. Manakli, et al., "Combination multiple focal planes and PSM for sub 120 nm node with KrF lithography: study of the proximity effects" Elsevier Microelectronic Engineering 61-62 (2002) pp. 123-132.

(Continued)

*Primary Examiner*—N Drew Richards
*Assistant Examiner*—Kyoung Lee

(57) ABSTRACT

A method includes forming a release layer of a semiconductor device being fabricated, where the release layer has a trapezoidal shape. The method also includes forming a cantilever, which has a cantilever arm formed over the release layer. The method further includes removing at least part of the release layer from under the cantilever arm. The release layer could be formed using a photo-resist material. The photo-resist material can be patterned by exposing the photo-resist material using multiple exposures. A first exposure could expose a portion of the photo-resist material, where the exposed portion has substantially vertical sides. A second exposure could give the exposed portion of the photo-resist material slanted sides. A wet etch could be performed to remove the release layer from under the cantilever arm.

20 Claims, 5 Drawing Sheets

OTHER PUBLICATIONS

Benedetto Vigna, "More than Moore: micro-machined products enable new applications and open new markets", 2005 IEEE, 8 pages.

Li-Heng Chou, et al., "Photo-focus modulation method for forming transistor gates and related transistor devices", U.S. Appl. No. 11/901,654, filed Sep. 18, 2007.

Alfred K. Wong, "Microlithography: Trends, Challenges, Solutions, and Their Impact on Design", 2003 IEEE, p. 12-21.

Jiankang Bu, et al., "System and Method for Providing Process Compliant Layout Optimization Using Optical Proximity Correction to Improve CMOS Compatible Non Volatile Memory Retention Reliability", U.S. Appl. No. 11/598,560, filed Nov. 13, 2006.

* cited by examiner

US 7,790,491 B1

METHOD FOR FORMING NON-VOLATILE MEMORY CELLS AND RELATED APPARATUS AND SYSTEM

TECHNICAL FIELD

This disclosure is generally directed to memory cells and more specifically to a method for forming non-volatile memory cells and related apparatus and system.

BACKGROUND

Conventional non-volatile memory (NVM) cells are routinely used in electronic circuitry, such as electronic consumer devices. However, fabricating conventional NVM cells using low-cost Complimentary Metal Oxide Semiconductor (CMOS) techniques presents various problems. For example, CMOS-compatible NVM cells are being scaled to smaller and smaller sizes, and the smaller sizes often create retention problems in memory cells. This means that the memory cells are often unable to retain their programming for a desired amount of time (such as ten years or more), so data stored in the memory cells can be prematurely lost. A common approach to circumvent this problem is to deposit an extra layer of gate oxide during fabrication of the memory cells. Unfortunately, this increases the complexity of the fabrication process and the cost of the memory cells. Moreover, multi-layer gate oxides often increase leakage currents in the memory cells, which can interfere with the operation of the memory cells.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 6, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
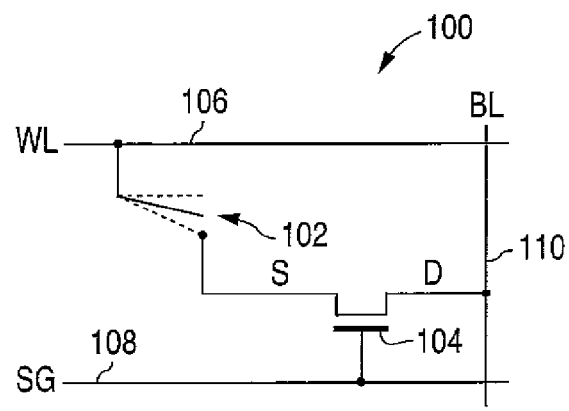
FIG. 1 illustrates an example non-volatile memory cell according to this disclosure.

FIG. 1 illustrates an example non-volatile memory cell 100 according to this disclosure. The embodiment of the memory cell 100 shown in FIG. 1 is for illustration only. Other embodiments of the memory cell 100 could be used without departing from the scope of this disclosure.

In this example, the memory cell 100 includes a cantilever 102, a transistor 104, a word line (WL) 106, a select gate (SG) line 108, and a bit line (BL) 110. As shown here, the cantilever 102 is coupled to the word line 106 and is selectively coupled to the transistor 104 (depending on the state of the cantilever 102). The transistor 104 has its source selectively coupled to the cantilever 102, its gate coupled to the select gate line 108, and its drain coupled to the bit line 110. Each of the lines 106-110 could represent a wire, trace, or other electrically conductive line, such as a back-end metal line formed from aluminum or copper.

The cantilever 102 represents a mechanical structure that physically moves, thereby selectively forming and breaking an electrical connection between the source of the transistor 104 and the word line 106. The cantilever 102 could represent any suitable mechanical structure that opens and closes or otherwise selectively forms an electrical connection, such as a conductive arm suspended over a conductive trace or interconnect.

The cantilever 102 can be controlled and caused to enter an opened or closed state, which allows the cantilever 102 to define the data value ("0" or "1") programmed into the memory cell 100. By itself, the cantilever 102 can identify the programmed or non-programmed state of the memory cell 100. However, the cantilever 102 is subject to disturbances, such as by signals on the various lines 106-110 that are intended for other memory cells in a memory array. These disturbances may cause unintended state changes of the cantilever 102. The transistor 104 is therefore used to couple the cantilever 102 to the select gate and bit lines 108-110. The transistor 104 can be referred to as an "access transistor" because it controls the programming, reading, and erasure of the memory cell 100. The transistor 104 helps to prevent disturbances from causing unintended state changes of the cantilever 102. The transistor 104 could represent any suitable transistor device, such as an n-channel metal oxide semiconductor (NMOS) transistor or other transistor.

During programming of the memory cell 100, higher voltages can be applied to the select gate and bit lines 108-110, and a lower voltage can be applied to the word line 106. This creates a voltage bias between the cantilever 102 and the source of the transistor 104. With an adequate voltage bias, electrostatic forces may move the cantilever 102 from the open position (referred to as state "0") to the closed position (referred to as state "1"). This programs the memory cell 100 to the "1" state. When the cantilever 102 closes (by forming an electrical connection with the transistor 104), the bonding force between metal or other conductive material and Van der Waals forces help to keep the cantilever 102 closed. Without any external disturbance to the cantilever 102, this helps to facilitate retention of a programmed "1" state in the memory cell 100, ideally until an erase operation occurs.

During reading of the memory cell 100, higher voltages can be applied to the select gate and bit lines 108-110, and a lower voltage can be applied to the word line 106. The higher voltage applied to the bit line 110 in the read operation could be less than the higher voltage applied to the bit line 110 in the programming operation. A determination can then be made regarding the state of the memory cell 100 based on an amount of current flowing through the memory cell 100. Little or no current flowing through the memory cell 100 indicates that the cantilever 102 is open. A greater amount of current flowing through the memory cell 100 indicates that the cantilever 102 is closed. This allows an external component to determine whether the memory cell 100 is operating in the "0" or "1" state.

During erasure of the memory cell 100, a higher voltage can be applied on the word line 106 and the select gate line 108, and a lower voltage can be applied on the bit line 110.

This helps to open the cantilever 102 and place the memory cell 100 in the "0" state, which removes the programmed "1" state of the memory cell 100.

In this example embodiment, the memory cell 100 represents a Micro Electro-Mechanical System (MEMS) device. In other words, the memory cell 100 includes both an electrical element (the transistor 104) and a mechanical element (the cantilever 102). Also, in particular embodiments, this type of memory cell 100 allows the cantilever 102 to be formed on the "back-end" of a fabrication process using standard CMOS or other platforms. For instance, the transistor 104 can be formed using standard CMOS processes, and it is subject to CMOS scaling and other issues. The cantilever 102 can then be formed over the transistor 104. As a result, CMOS scaling issues may not affect retention in the memory cell 100 since it is the cantilever 102 that determines the state of the memory cell 100 (and the cantilever 102 is not necessarily subject to the same scaling and other issues). Moreover, "front-end" process variations in the standard CMOS or other platforms may not affect the operation of the cantilever 102. This may allow the memory cell 100 to be used with a wide variety of CMOS processes, such as deep submicron CMOS platforms. In addition, the back-end processing may not affect the transistor 104 since the back-end processing can occur at lower temperatures and intermediate layers (such as a dielectric layer of several microns) can protect the transistor 104.

Although FIG. 1 illustrates one example of a non-volatile memory cell 100, various changes may be made to FIG. 1. For example, the layout and arrangement of the cantilever 102, the transistor 104, and the signal lines 106-110 are for illustration only. Also, while described as being in the "1" state when the cantilever 102 is closed, the memory cell 100 could have a "0" state when the cantilever 102 is closed.

Figure 2A:
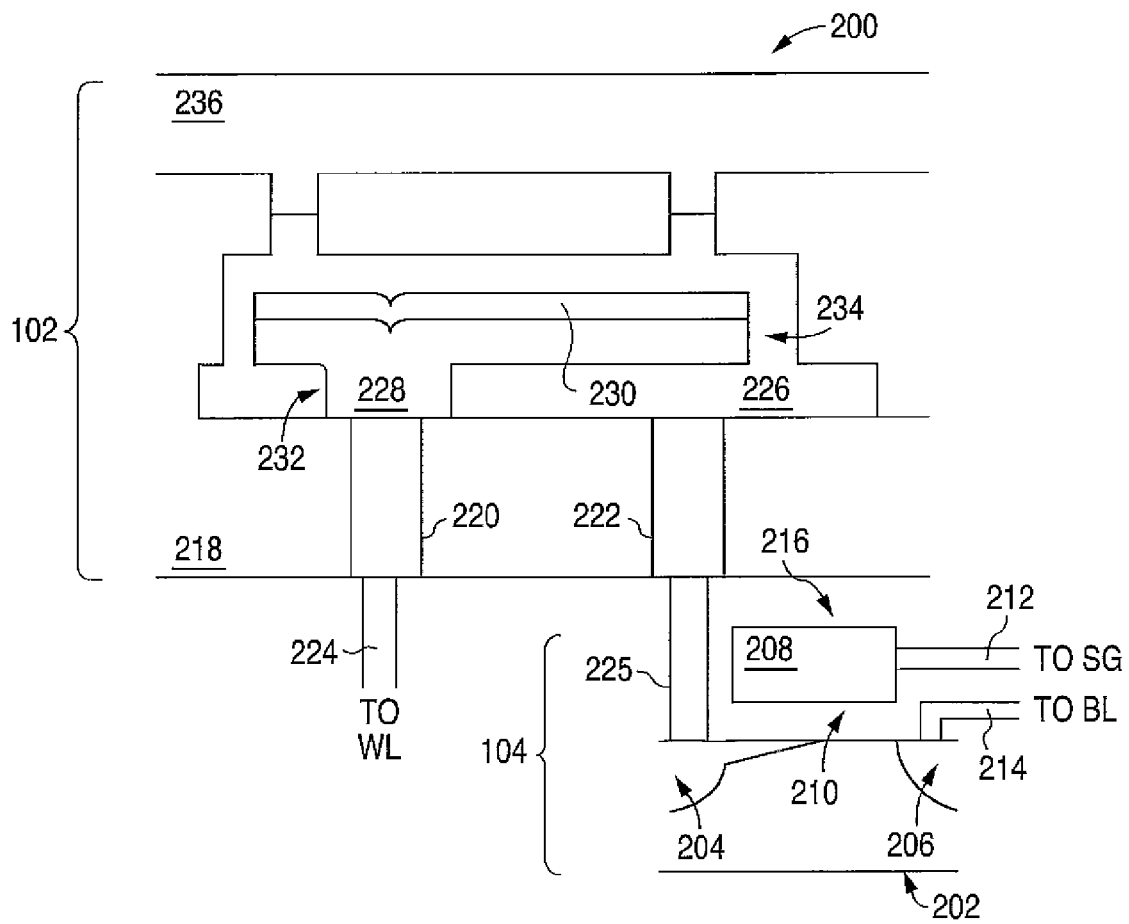
FIGS. 2A and 2B illustrate a cross-section of an example non-volatile memory cell according to this disclosure.
Figure 2B:
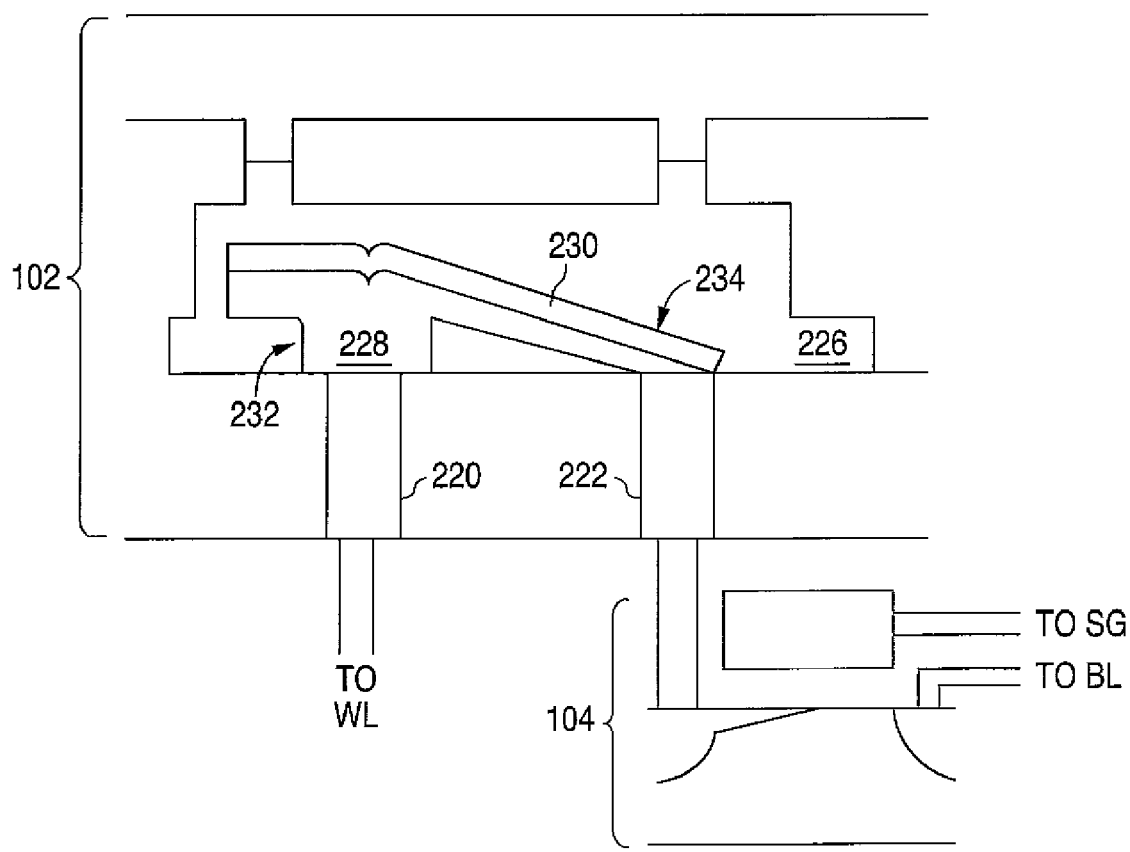

FIGS. 2A and 2B illustrate a cross-section 200 of an example non-volatile memory cell according to this disclosure. The embodiment of the cross-section 200 shown in FIGS. 2A and 2B is for illustration only. Memory cells with other cross-sections could be used without departing from the scope of this disclosure.

As shown in FIG. 2A, a memory cell includes the transistor 104, which can be formed in any suitable manner (such as by using standard or other CMOS processes). In this example, the transistor 104 is formed in and over a substrate 202. The substrate 202 could represent any suitable semiconductor substrate, such as silicon. A source region 204 and a drain region 206 are formed within the substrate 202. The source and drain regions 204-206 represent areas of the substrate 202 that have been doped with one or more suitable dopants. For example, the source and drain regions 204-206 could represent areas of a p-type substrate 202 that are doped with an n-type implant. A gate 208 is formed over the substrate 202. The gate 208 represents any suitable structure acting as a gate of the transistor 104, such as a metallic or other conductive structure. The gate 208 is separated from the substrate 202 by an oxide 210, which is often referred to as the "gate oxide" of the transistor 104. In some embodiments, only a single gate oxide layer is used in the transistor 104. A conductive line 212 couples the gate 208 to a select gate line, and a conductive line 212 couples the drain region 206 to a bit line.

After formation of the transistor 104, one or more intermediate layers 216 can be formed over the transistor 104. These could include, for example, various oxide or other protective layers. The intermediate layers 216 could also have any suitable thickness(es), such as a combined thickness of several microns.

The cantilever 102 is then formed over the intermediate layers 216. In some embodiments, the cantilever 102 can be formed at lower temperatures than those used during formation of the transistor 104. Also, the intermediate layers 216 can provide protection to the transistor 104 during formation of the cantilever 102.

In this example, the cantilever 102 is formed in one or more dielectric layers (collectively referred to as dielectric layer 218). While the dielectric layer 218 is shown as a single layer here, the dielectric layer 218 could include multiple layers that are formed during the fabrication of different components of the cantilever 102. In this embodiment, conductive interconnects 220-222 are formed through a lower portion of the dielectric layer 218. The conductive interconnect 220 provides an electrical connection between the cantilever 102 and a conductive line 224, which can be coupled to a word line. The conductive interconnect 222 provides an electrical connection between the cantilever 102 and a conductive line 225, which is coupled to the source region 204 of the transistor 104.

The actual mechanical (moving) structure of the cantilever 102 is formed within a cavity 226 in the dielectric layer 218. Again, it may be noted that the cavity 226 could represent a collection of openings formed in multiple dielectric layers forming the dielectric layer 218. The cantilever 102 here includes a conductive layer 228 and an oxide layer 230. The conductive layer 228 forms a base of the cantilever, and the conductive layer 228 and the oxide layer 230 form an arm 234 of the cantilever. The arm 234 projects out from the base 232 and can move between an open position (shown in FIG. 2A) and a closed position (shown in FIG. 2B). When in the closed position, the conductive layer 228 forms an electrical connection between the conductive interconnects 220-222, thereby electrically coupling the word line and the transistor 104. The conductive layer 228 can be formed from any suitable conductive material(s), such as a high-stress conductive material. Also, the oxide layer 230 could represent any suitable dielectric material.

A cap 236 is formed over the dielectric layer 218. The cap 236 could represent any suitable material(s) for protecting the cantilever 102. The cap 236 could, for example, represent an encapsulating material.

Although FIGS. 2A and 2B illustrate one example of a cross-section 200 of a non-volatile memory cell, various changes may be made to FIGS. 2A and 2B. For example, any other suitable cantilever 102 or transistor 104 could be used in the non-volatile memory cell 100.

FIGS. 3 and 4A through 4C illustrate an example technique for forming a cantilever in a non-volatile memory cell according to this disclosure. The technique shown in FIGS. 3 and 4A through 4C is for illustration only. Other techniques could be used to form a cantilever in a non-volatile memory cell without departing from the scope of this disclosure.

Figure 3:
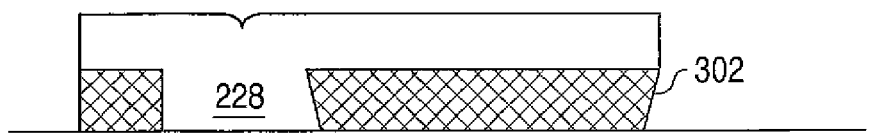
FIGS. 3 and 4A through 4C illustrate an example technique for forming a cantilever in a non-volatile memory cell according to this disclosure.

In FIG. 3, the cantilever 102 can be formed by depositing one or more conductive materials over a release layer 302. The release layer 302 can be formed from any suitable material(s), such as silicon nitride, silicon dioxide, or aluminum oxide. One or more dielectric materials could also be deposited over the conductive materials to form the oxide layer 230. After patterning the deposited material(s) to form the conductive layer 228 (and possibly the oxide layer 230), the release layer 302 is removed to allow the arm 234 to move. However, it may be very difficult to completely remove the release layer 302 from under the conductive layer 228, particularly when the aspect ratio of the arm 234 (its length divided by its width) is large. Residue of the release layer 302 may remain between the conductive layer 228 and the conductive interconnect 222, which can cause malfunctions of the memory cell 100. Also, overetching of the release layer 302 could damage the conductive layer 228 and increase its contact resistance, which can also cause malfunctions of the memory cell 100.

In accordance with this disclosure, as shown in FIG. 3, at least a portion of the release layer 302 is formed with a trapezoidal shape, generally defined as having two opposing surfaces (one longer and one shorter) with slanted sides between the surfaces. Forming the release layer 302 under the arm 234 of the cantilever 102 in this way helps to facilitate more efficient removal of the release layer 302. For example, this trapezoidal shape may allow a wet etch material to more easily etch away the release layer 302 along its bottom surface. This can help to reduce the amount of release layer residue remaining after the etch.

Figure 4A:
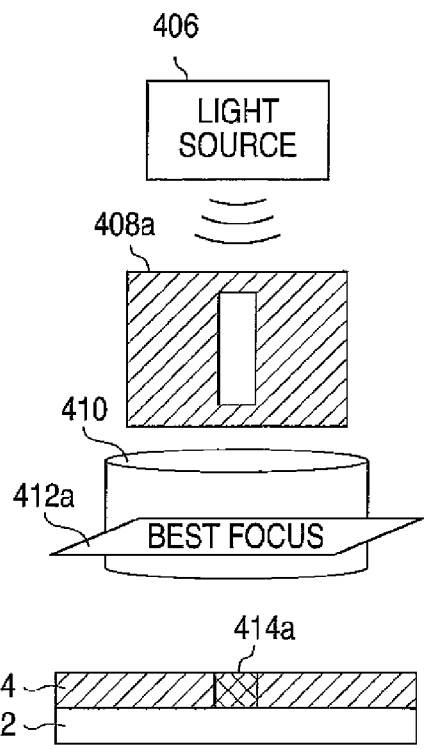
Figure 4B:
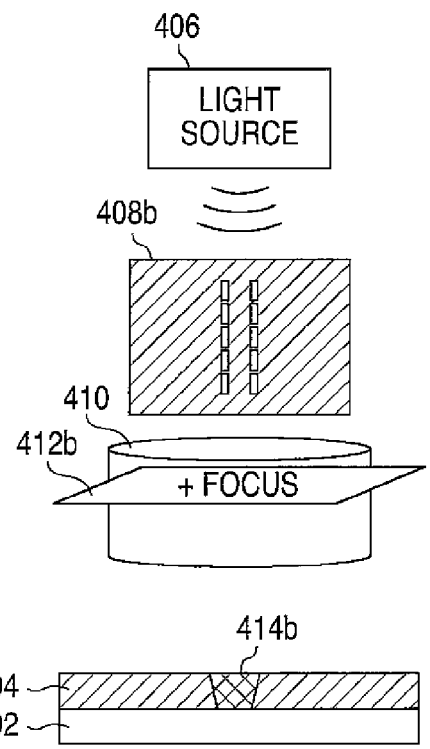
Figure 4C:
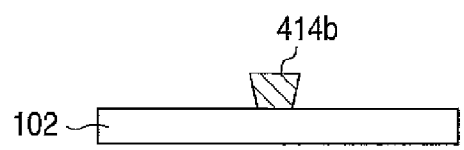

A mechanism for forming a trapezoidal portion of a release layer is shown in FIGS. 4A through 4C. In this example, a release layer is formed using a photo-resist material, which is exposed in a manner that creates the trapezoidal resist profile. More specifically, a negative-tone photo-resist material is used, and the photo-resist material undergoes multiple exposures using different masks and different focuses to shape the resist profile.

As shown in FIG. 4A, an underlying layer 402 (such as the intermediate layers 216 of the memory cell 100) undergoes a deposition process to form a photo-resist layer 404. The photo-resist layer 404 includes any suitable photo-resist material(s) and can be deposited in any suitable manner, such as by spin-coating. The photo-resist layer 404 may require further processing, such as pre-baking, to prepare the photo-resist layer 404 for use.

After the photo-resist layer 404 is ready for further processing, the structure undergoes photolithography to pattern the photo-resist layer 404. In this example embodiment, the photo-resist layer 404 undergoes two exposures. The first exposure patterns the photo-resist layer 404 using its normal line and space pattern definitions. The second exposure modifies the resist profile so that the top of the resist profile is wider. In this way, control of both the resist profile and its critical dimensions can be achieved.

FIG. 4A illustrates the first exposure of the photo-resist layer 404. In FIG. 4A, a light source 406 generates light used to pattern the photo-resist layer 404. The light source 406 includes any suitable source of light or other radiation that can be used to pattern photo-resist material. The light source 406 could, for example, represent an ultraviolet light source.

The light from the light source 406 passes through a first reticle 408a. The reticle 408a creates a pattern of light on the photo-resist layer 404, which allows the photo-resist layer 404 to be patterned in a specific way. In particular, the reticle 408a allows the light from the light source 406 to reach certain portions of the photo-resist material and prevents the light from reaching other portions of the photo-resist material. In this example, the reticle 408a allows the light from the light source 406 to reach one portion 414a of the photo-resist layer 404. The reticle 408a includes any suitable structure for creating patterns of light on photo-resist material, such as a patterned layer of chromium on a quartz substrate.

The light from the light source 406 that passes through the reticle 408a also passes through a projection lens 410. The projection lens 410 can be used to focus the light from the light source 406 onto the photo-resist layer 404. The projection lens 410 includes any suitable optics for focusing light.

During the first exposure of the photo-resist layer 404, the projection lens 410 and/or the underlying layer 402 is positioned so that the pattern from the reticle 408a is clearly imaged on the photo-resist layer 404. In some embodiments, this position can represent the "best focus" position and can be represented by a "best focus" plane 412a. In this position, the pattern from the reticle 408a is sharply focused on the photo-resist layer 404, possibly to the best extent achievable. Because best focus is used during this first exposure, the exposed portion 414a of the photo-resist layer 404 has generally vertical sides.

FIG. 4B illustrates the second exposure of the photo-resist layer 404. As shown in FIG. 4B, the light source 406 is again used to pattern the photo-resist layer 404, and the light from the light source 406 passes through a second reticle 408b. In this example, the reticle 408b prevents the light from reaching the majority of the photo-resist layer 404, only allowing the light to reach the outer edges of the exposed portion 414a of the photo-resist layer 404. Also, the projection lens 410 and/or the underlying layer 402 is positioned so that the pattern from the reticle 408b is "positively focused" on the photo-resist layer 404. This refers to the fact that the focal plane used during the second exposure is closer to the reticle 408b compared to the focal plane used during the first exposure. The positive focus causes the exposed portion 414a to increase in size, forming a larger exposed portion 414b. However, the positive focus increases the size of the exposed portion 414a more along its upper portion, causing the resulting exposed portion 414b to have slanted sides. As a result, the exposed portion 414b obtains a trapezoidal cross-sectional shape.

At this point, the photo-resist layer 404 undergoes additional processing that removes the unexposed portions of the photo-resist layer 404 as shown in FIG. 4C. This leaves the exposed portion 414b of the photo-resist layer 404 on the underlying layer 402. Conductive material can then be deposited over the exposed portion 414b of the photo-resist layer 404 and patterned to form the conductive layer 228 in the cantilever 102. At a later point, the exposed portion 414b of the photo-resist layer 404 can be etched or otherwise removed, and the slanted sides of the exposed portion 414b help to facilitate more complete removal of the photo-resist material.

Although FIGS. 3 and 4A through 4C illustrate one example of a technique for forming a cantilever in a non-volatile memory cell, various changes may be made to FIGS. 3 and 4A through 4C. For example, this technique could be used to form a release layer having any suitable size and shape. Also, while shown as being used to form a single exposed portion 414b, this technique could be used to form any suitable number of release layers in any suitable arrangement. In addition, memory cells could include other cantilevers that are formed without using release layers patterned in this way.

Figure 5:
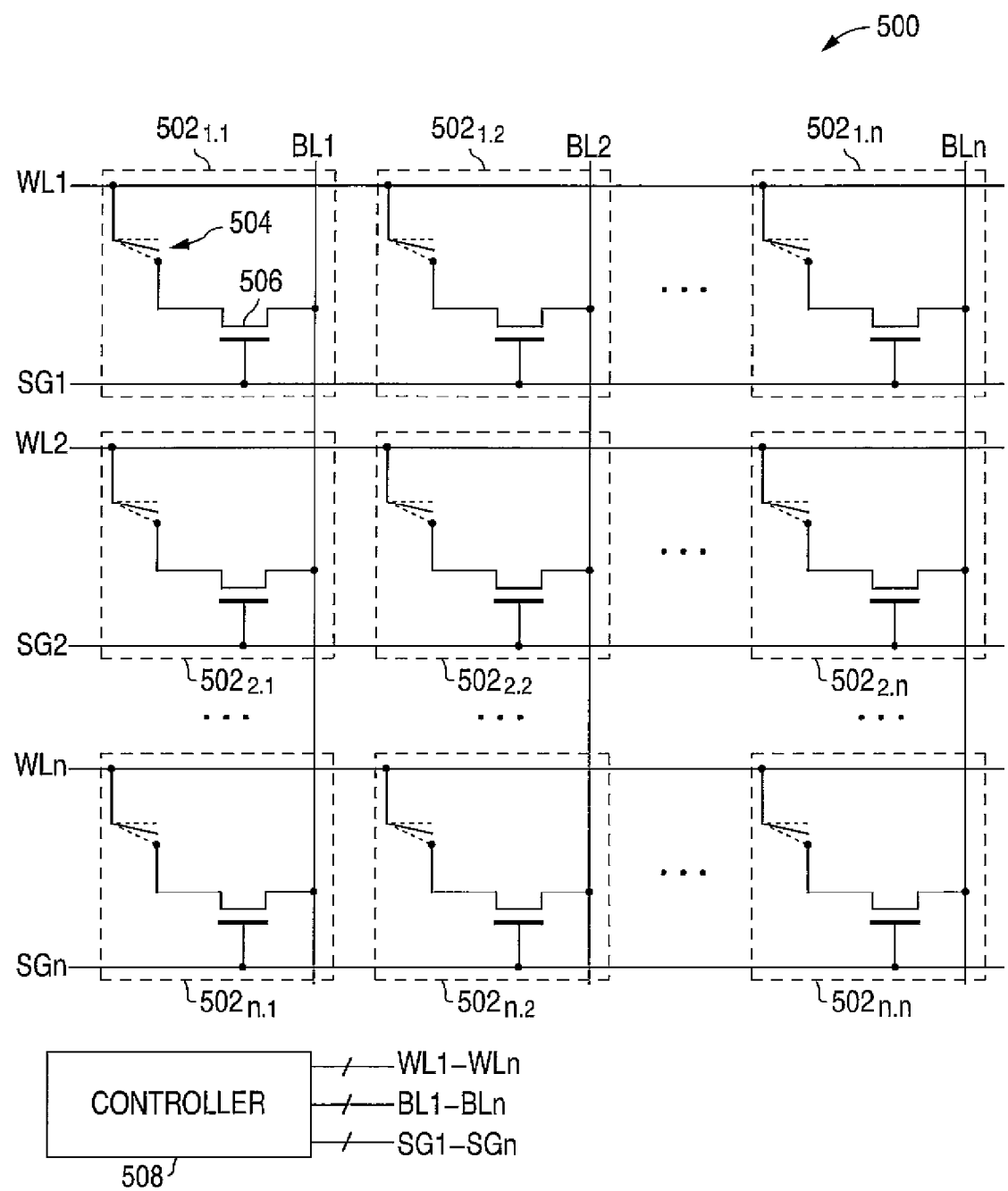
FIG. 5 illustrates an example non-volatile memory cell array according to this disclosure.

FIG. 5 illustrates an example non-volatile memory cell array 500 according to this disclosure. The embodiment of the memory cell array 500 shown in FIG. 5 is for illustration only. Other embodiments of the memory cell array 500 could be used without departing from the scope of this disclosure.

In this example, the memory cell array 500 is formed from various memory cells $502_{1,1}$-$502_{1,n}$, $502_{2,1}$-$502_{2,n}$, . . . $502_{n,1}$-$502_{n,n}$. At least some of the memory cells may be the same as or similar to the memory cell 100 shown in FIG. 1. Each memory cell could include a cantilever 504 and an access transistor 506. Each memory cell is coupled to one of multiple word lines (WL1-WLn), one of multiple select gate lines (SG1-SGn), and one of multiple bit lines (BL1-BLn). Each transistor 506 has its source coupled to one of the cantilevers 504, a gate coupled to one of the select gate lines, and its drain coupled to one of the bit lines.

The memory array 500 also includes or is coupled to a controller 508. The controller 508 represents any suitable structure for controlling the operation of the memory cells in the array 500. In this example, the controller 508 is coupled to the word lines, bit lines, and select gate lines of the array 500 and provides suitable control signals to the lines. This enables the controller 508 to control, for example, the programming and reading of the memory cells in the array 500.

In this arrangement, a memory cell can be programmed by setting its bit line BLx and select gate line SGx higher and its word line WLx lower. Other lines can be kept lower. In this configuration, the select gate line SGx turns on the access transistors 506 in the memory cell along the word line WLx (the memory cell being programmed). A voltage bias causes the cantilever 504 in the memory cell being programmed to reach state "1." If the memory cell is already in state "1," this programming operation enhances the memory cell's current state. During this programming, other memory cells along the word line WLx are not disturbed since their word lines and bit lines are kept lower. Also, other memory cells along other word lines are not disturbed since their access transistors 506 are not on and their word lines are kept lower.

To read the state of a memory cell, its select gate line SGx and bit line BLx are set higher (the bit line BLx may not be set as high as during the programming), and its word line WLx is set lower. In this arrangement, the access transistor 506 in the memory cell being read is turned on and creates a conducting path. An array sense amplifier or other external circuitry could then detect a current flowing through the word line WLx, such as by determining whether the current's amplitude is lower or higher. During the read operation, other signal lines can be set lower to avoid creating read disturbances in the other memory cells.

To erase a memory cell, a higher voltage can be applied on its word line WLx and its select gate line SGx, and a lower voltage can be applied on its bit line BLx. Also, all memory cells along the word line WLx can be erased if their select gate lines are higher and their bit lines are lower. In addition, all memory cells in the array 500 can be erased when their select gate lines are higher, their bit lines are lower, and a higher voltage is applied on all word lines.

Any suitable voltage values could be used here during the programming, reading, and erasing operations. Example voltages are provided in Table 1, although other suitable voltages could be used depending on the implementation.

TABLE 1

| Operation | Selected Cell's WL | Selected Cell's GS | Selected Cell's BL |
|---|---|---|---|
| Program | 0.75 V | 4.5 V | 4.5 V |
| Read | 0.75 V | 4.5 V | 1.6 V |
| Erase | 4.5 V | 4.5 V | 0.75 V |

Although FIG. 5 illustrates one example of a non-volatile memory cell array 500, various changes may be made to FIG. 5. For example, the memory cell array 500 could have any suitable number of memory cells in any suitable arrangement. As a particular example, while shown as an n×n array, the memory cell array 500 could have any other equal or non-equal dimensions.

Figure 6:
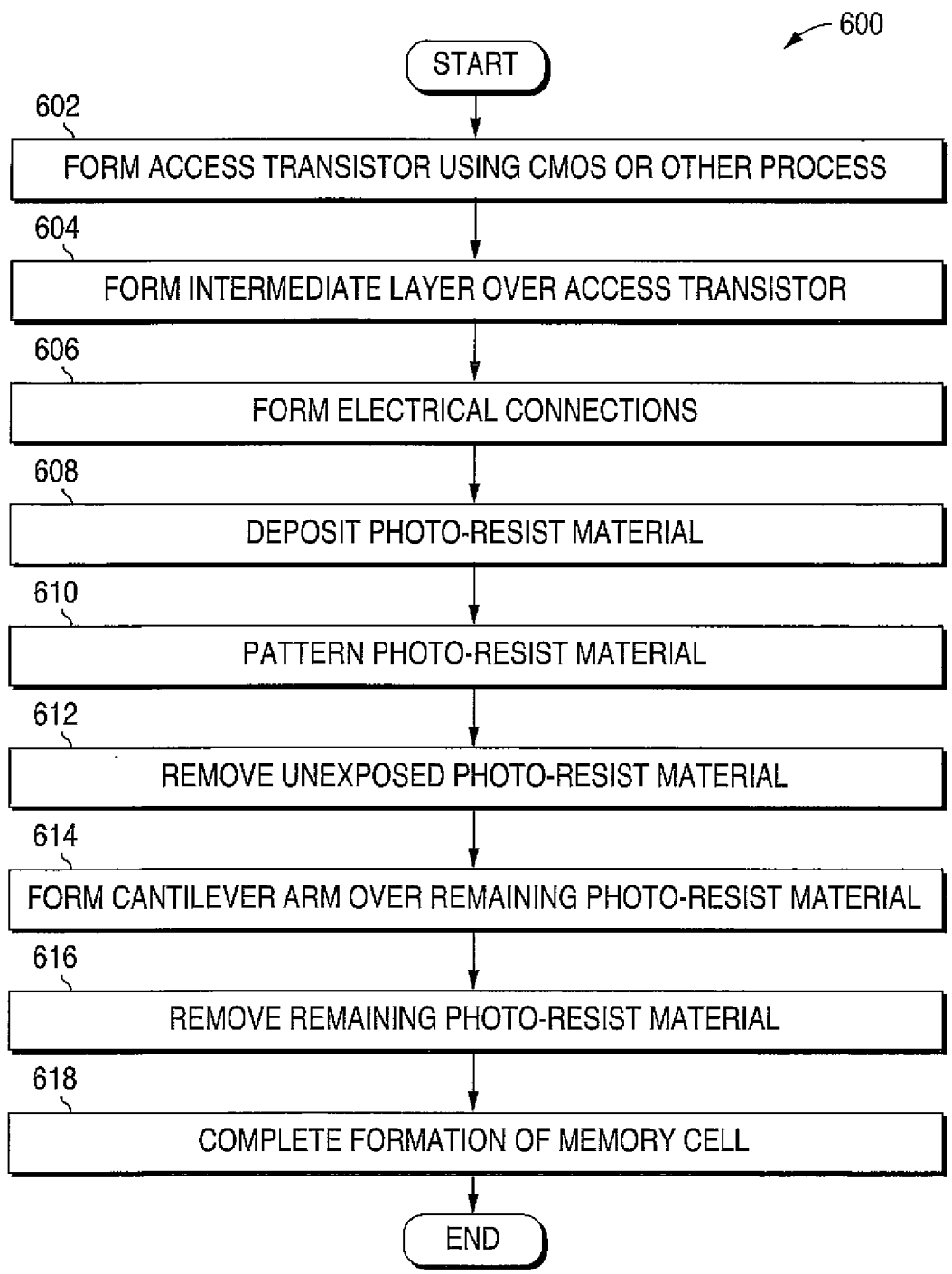
FIG. 6 illustrates an example method for forming a non-volatile memory cell with a cantilever according to this disclosure.

FIG. 6 illustrates an example method 600 for forming a non-volatile memory cell with a cantilever according to this disclosure. The embodiment of the method 600 shown in FIG. 6 is for illustration only. Other embodiments of the method 600 could be used without departing from the scope of this disclosure.

An access transistor is formed using standard CMOS or other processes at step 602. This could include, for example, forming source and drain implants in a semiconductor substrate and forming a gate over the substrate. Any suitable fabrication components could be used to form the access transistor, such as a deep submicron CMOS platform. One or more intermediate layers are formed over the access transistor at step 604. This could include, for example, depositing one or more oxide layers several microns thick over the access transistor. One or more electrical connections are formed at step 606. This could include, for example, forming connections to a word line, a select gate line, and a bit line. This could also include forming conductive interconnects through one or more dielectric layers above the access transistor to the word line and the access transistor.

A photo-resist material is deposited at step 608. This could include, for example, depositing a negative-tone photo-resist layer over one or more dielectric layers above the access transistor. The photo-resist material is patterned at step 610. This may include, for example, exposing the photo-resist layer so that the exposed portion of the material has a trapezoidal shape. In particular embodiments, the photo-resist layer is exposed twice, once using best focus and once using positive focus. The best focus could be used to control the general shape of the exposed portion of the photo-resist material, and the positive focus could be used to give the exposed portion of the photo-resist material a trapezoidal shape. The exposed portion of the photo-resist material is removed at step 612.

A cantilever arm is formed over the remaining photo-resist material at step 614. This could include, for example, depositing a layer of conductive material and a layer of oxide or other dielectric. Parts of the conductive material and the dielectric material are deposited over the remaining photo-resist material. This could also include etching the conductive material and the dielectric material into the proper shape to form the cantilever's base and arm. The arm extends at least partially over part or all of the remaining photo-resist material. The remaining photo-resist material is removed at step 616. This could include performing a wet etch to remove the remaining photo-resist material from under the cantilever arm. The trapezoidal shape of the remaining photo-resist material facilitates more effective removal of the photo-resist material, resulting in less or no residue under the cantilever arm.

The formation of the memory cell is completed at step 618. This could include, for example, depositing any additional dielectric materials or encapsulating materials. This could also include performing clean-up steps or any other steps to complete the formation of the memory cell.

Although FIG. 6 illustrates one example of a method 600 for forming a non-volatile memory cell with a cantilever, various changes may be made to FIG. 6. For example, while shown as a series of steps, various steps in FIG. 6 could overlap, occur in parallel, or occur multiple times. Also, the method 600 could be used to form multiple memory cells, such as memory cells in a memory cell array.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
   forming a release layer of a semiconductor device being fabricated, the release layer having a trapezoidal shape and formed by depositing and patterning a layer of photo-resist material;
   forming a cantilever, the cantilever comprising a cantilever arm formed over the release layer; and
   removing at least part of the release layer from under the cantilever arm;
   wherein patterning the layer of photo-resist material comprises:
   performing a first exposure to expose a portion of the photo-resist material, the exposed portion of the photo-resist material having substantially vertical sides; and
   performing a second exposure to give the exposed portion of the photo-resist material slanted sides.

2. The method of claim 1, wherein:
   performing the first exposure comprises performing a best focus exposure of the photo-resist material; and
   performing the second exposure comprises performing a positive focus exposure of the photo-resist material.

3. The method of claim 1, further comprising:
   forming a transistor prior to forming the release layer and the cantilever; and
   forming at least one electrical connection for electrically coupling the cantilever and the transistor.

4. A method comprising:
   forming a release layer of a semiconductor device being fabricated;
   forming a cantilever, the cantilever comprising a cantilever arm formed over the release layer; and
   removing at least part of the release layer from under the cantilever arm;
   wherein forming the cantilever comprises:
   depositing a layer of conductive material;
   depositing a layer of dielectric material over the layer of conductive material; and
   etching the layer of conductive material and the layer of dielectric material to form the cantilever;
   wherein a portion of the conductive material and a portion of the dielectric material are deposited over the release layer.

5. The method of claim 4, wherein removing at least part of the release layer from under the cantilever arm comprises performing a wet etch.

6. A method comprising:
   forming a transistor of a semiconductor device being fabricated;
   forming a release layer;
   forming a cantilever, the cantilever comprising a cantilever arm formed over the release layer;
   removing at least part of the release layer from under the cantilever arm;
   forming at least one electrical connection for electrically coupling the cantilever and the transistor;
   coupling the cantilever to a first signal line; and
   coupling the transistor to a second signal line and a third signal line.

7. The method of claim 6, wherein the cantilever and the transistor form a memory cell; and
   further comprising programming, reading, and erasing the memory cell by providing signals over the signal lines.

8. The method of claim 7, wherein:
   programming the memory cell comprises causing the cantilever arm to move to a first position, the first position associated with a first data value;
   erasing the memory cell comprises causing the cantilever arm to move to a second position, the second position associated with a second data value; and
   the cantilever arm when in one of the first and second positions forms an electrical connection between the first signal line and the transistor.

9. A memory cell comprising:
   a cantilever configured to mechanically move between a first position and a second position, the cantilever in electrical contact with a first signal line; and
   a transistor having a gate in electrical contact with a second signal line, a source in electrical contact with one of: the cantilever and a third signal line, and a drain in electrical contact with another of: the cantilever and the third signal line;
   wherein the cantilever forms an electrical connection between the first signal line and the transistor when in the first position but not when in the second position.

10. The memory cell of claim 9, wherein the cantilever comprises:
    a base in electrical contact with the first signal line; and
    an arm coupled to the base and configured to move between the first and second positions.

11. The memory cell of claim 10, wherein the base and the arm of the cantilever comprise:
    a layer of conductive material; and
    a layer of dielectric material over the layer of conductive material.

12. The memory cell of claim 10, wherein:
    the cantilever is over the transistor; and
    further comprising a plurality of conductive interconnects, one of the conductive interconnects electrically coupling the base of the cantilever to the first signal line, another of the conductive interconnects electrically coupling the arm of the cantilever to the transistor when the arm is in the first position.

13. The memory cell of claim 9, wherein the cantilever forms the electrical connection between the first signal line and the transistor in response to higher voltages applied to the second and third signal lines and a lower voltage applied to the first signal line.

14. The memory cell of claim 9, wherein the cantilever breaks the electrical connection between the first signal line and the transistor in response to higher voltages applied to the first and second signal lines and a lower voltage applied to the third signal line.

15. The memory cell of claim 9, wherein a current through the memory cell identifies the position of the cantilever in response to higher voltages applied to the second and third signal lines and a lower voltage applied to the first signal line.

16. The memory cell of claim 9, wherein the transistor comprises an n-channel Metal Oxide Semiconductor (NMOS) transistor, the source of the NMOS transistor is in electrical contact with the cantilever, and the drain of the NMOS transistor is in electrical contact with the third signal line.

17. A memory array comprising a plurality of memory cells, at least one of the memory cells comprising:
- a cantilever configured to mechanically move between a first position and a second position, the cantilever in electrical contact with a first signal line; and
- a transistor having a gate in electrical contact with a second signal line, a source in electrical contact with one of: the cantilever and a third signal line, and a drain in electrical contact with another of: the cantilever and the third signal line;
- wherein the first and second positions of the cantilever are associated with different data values.

18. The memory array of claim 17, further comprising:
- a controller coupled to the first, second, and third signal lines, the controller configured to generate signals for programming, reading, and erasing the memory cells.

19. A method comprising:

at least one of:
- programming a memory cell by causing a cantilever arm of a cantilever in the memory cell to move to a first position, the first position associated with a first data value;
- erasing the memory cell by causing the cantilever arm to move to a second position, the second position associated with a second data value; and reading the memory cell by determining whether an amount of current through the memory cell indicates that the cantilever arm is in the first position or in the second position.

20. The method of claim 19, wherein:

the cantilever is in electrical contact with a first signal line;

the cantilever arm is in electrical contact with a transistor when in one of the first and second positions;

the transistor has a gate in electrical contact with a second signal line, the transistor further in electrical contact with a third signal line; and the memory cell is programmed, erased, and read based on signals provided over the signal lines.

* * * * *